(12) United States Patent
Yamamoto et al.

(10) Patent No.: US 10,396,002 B2
(45) Date of Patent: Aug. 27, 2019

(54) ELECTRONIC COMPONENT STORAGE SUBSTRATE AND HOUSING PACKAGE

(71) Applicant: KYOCERA Corporation, Kyoto-shi, Kyoto (JP)

(72) Inventors: Sentaro Yamamoto, Kagoshima (JP); Youji Furukubo, Kirishima (JP); Masanori Okamoto, Kirishima (JP); Yuhei Matsumoto, Kirishima (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 15/560,426

(22) PCT Filed: Mar. 17, 2016

(86) PCT No.: PCT/JP2016/058548
§ 371 (c)(1),
(2) Date: Sep. 21, 2017

(87) PCT Pub. No.: WO2016/152733
PCT Pub. Date: Sep. 29, 2016

(65) Prior Publication Data
US 2018/0090405 A1    Mar. 29, 2018

(30) Foreign Application Priority Data
Mar. 24, 2015 (JP) .................... 2015-061089

(51) Int. Cl.
*H01L 23/10*    (2006.01)
*H01L 23/08*    (2006.01)
(Continued)

(52) U.S. Cl.
CPC .......... *H01L 23/10* (2013.01); *H01L 21/4807* (2013.01); *H01L 21/4817* (2013.01);
(Continued)

(58) Field of Classification Search
USPC .................................... 361/760, 761
See application file for complete search history.

(56) References Cited

U.S. PATENT DOCUMENTS
2013/0063001 A1    3/2013    Takahashi et al.

FOREIGN PATENT DOCUMENTS
CN    103703559 A    4/2014
JP    H11-214945 A    8/1999
(Continued)

OTHER PUBLICATIONS
International Search Report (Form PCT/ISA/210) dated May 31, 2016, issued for PCT/JP2016/058548.
(Continued)

Primary Examiner — Andargie M Aychillhum
(74) Attorney, Agent, or Firm — Volpe and Koenig, P.C.

(57) ABSTRACT

The present invention includes: a substrate 3, a rectangular frame-shaped substrate bank section 5 provided on the substrate 3 and including four corner portions 5A, and a metal layer 9 provided on a top surface 5Aa of the substrate bank section 5. A top surface 5Aa of the corner portions 5A of the substrate bank section 5 may have an inclined portion S slanted downward. An electronic component housing package may have a lid welded onto the metal layer 9 provided on the substrate bank section 5 of the electronic component storage substrate.

20 Claims, 12 Drawing Sheets

(51) Int. Cl.
      *H01L 21/48*       (2006.01)
      *H01L 23/057*      (2006.01)
      *H03H 9/17*        (2006.01)
      *H03H 9/10*        (2006.01)
      *H01L 23/053*      (2006.01)
      *H01L 41/053*      (2006.01)

(52) U.S. Cl.
     CPC .......... *H01L 23/053* (2013.01); *H01L 23/057* (2013.01); *H01L 23/08* (2013.01); *H03H 9/10* (2013.01); *H03H 9/17* (2013.01); *H01L 41/053* (2013.01); *H01L 2924/16315* (2013.01)

(56) References Cited

FOREIGN PATENT DOCUMENTS

| | | | |
|---|---|---|---|
| JP | 2001-176996 | * | 6/2001 |
| JP | 2001-176996 A | | 6/2001 |
| JP | 2001-274649 A | | 10/2001 |
| JP | 2003-046012 A | | 2/2003 |
| JP | 2003046012 A | * | 2/2003 |
| JP | 2008-147553 A | | 6/2008 |
| JP | 2013-062579 A | | 4/2013 |
| JP | WO 2014/017110 A1 | * | 1/2014 |
| JP | 2015-159204 A | | 9/2015 |
| WO | 2014017110 A1 | | 1/2014 |

OTHER PUBLICATIONS

Written Opinion (PCT/ISA/237) dated May 31, 2016, issued for PCT/JP2016/058548.

* cited by examiner

FIG. 12A
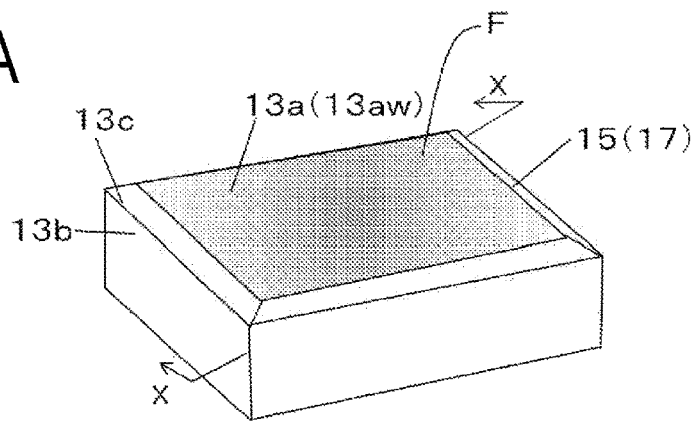
FIG. 12B
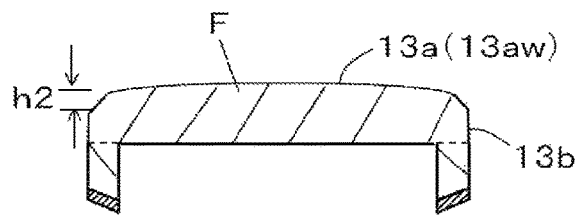
FIG. 13A1
FIG. 13A2
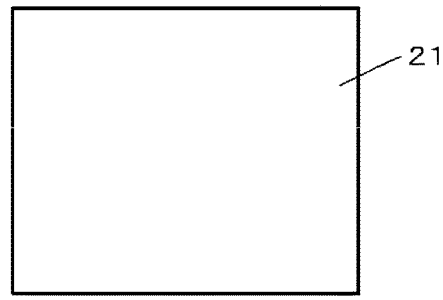
FIG. 13B1
FIG. 13B2
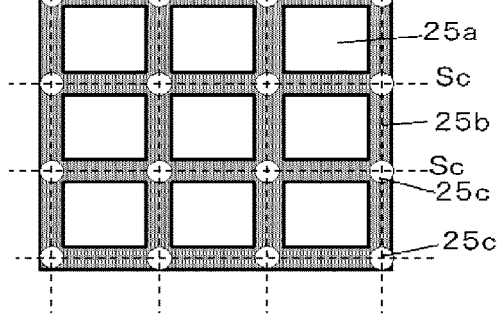

FIG. 14C1
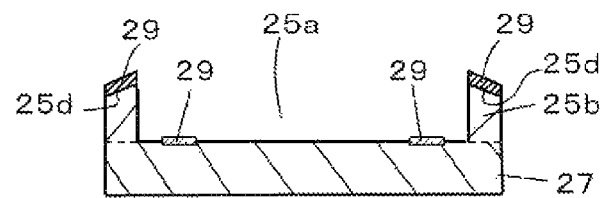
FIG. 14C2
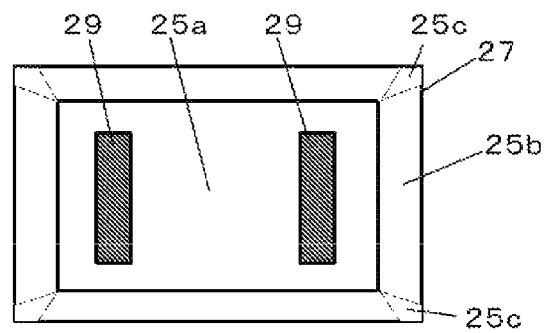
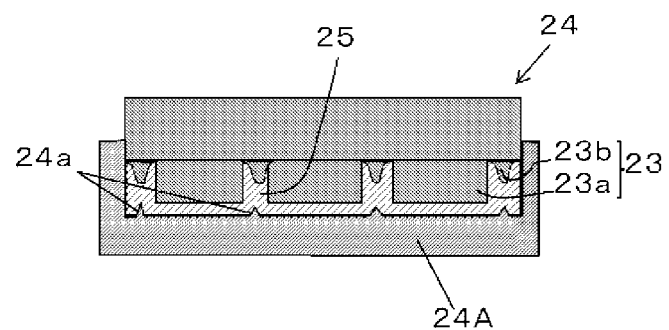
FIG. 15

ELECTRONIC COMPONENT STORAGE SUBSTRATE AND HOUSING PACKAGE

TECHNICAL FIELD

The present invention relates to an electronic component storage substrate and an electronic component housing package.

BACKGROUND

Examples of electronic components that require hermetic sealing include crystal application products such as crystal resonators and semiconductor elements such as flash memory. A metal thin-film electrode is formed on a front surface of each of these various electronic components, and the electronic components are mounted on a housing such as an electronic component storage substrate and hermetically sealed to protect the metal thin-film electrode from the outside air.

FIGS. 16A and 16B are exploded perspective views of a conventional electronic component housing package. FIG. 16B illustrates a cross-sectional view taken along line X-X in FIG. 16A. FIG. 17A is a perspective view that schematically illustrates a conventional electronic component storage substrate. FIG. 17B is a plan view of the electronic component storage substrate illustrated in FIG. 17A as seen from the position of the line Y-Y in FIG. 17A. An electronic component storage substrate 101 for mounting an electronic component 100 such as a crystal application product includes: a substrate 105 having a mounting surface 103 for the electronic component 100 on its main surface, as well as a rectangular frame-shaped substrate bank section 109 having four corner portions 107 provided on the substrate 105. Additionally, a metal layer 111 may be formed on the front surface of the substrate bank section 109. Further, a lid 113 may be bonded to a top surface of the metal layer 111 via a bonding material 112. In such a configuration, a bonding method such as seam welding, for instance, may be used to join the lid 113 and the metal layer 111 (see, for example, Patent Document 1).

In recent years, electronic devices such as mobile phones and IC cards are growing in prevalence. In addition to improved performance, electronic devices are required to become increasingly smaller and thinner. Accordingly, electronic components 100 and the electronic component storage substrates 101 on which they are stored are also required to become even smaller in size.

CITATION LIST

Patent Literature

Patent Document 1: JP-A-2001-274649

SUMMARY OF INVENTION

The electronic component storage substrate of the present disclosure includes: a substrate, a rectangular frame-shaped substrate bank section including a corner portion having four corners disposed on the substrate, and a metal layer provided on a top surface of the substrate bank section, wherein an upper surface of the corner portion of the substrate bank section has an inclined portion slanted downward from an inner surface of the substrate bank section toward an outer surface.

The electronic component housing package of the present disclosure may include a lid welded onto a metal layer provided on a substrate bank section of the electronic component storage substrate described above.

BRIEF DESCRIPTION OF DRAWINGS

FIG. 1B illustrates a cross-sectional view taken along line X-X of FIG. 1A.

FIG. 12A is a perspective view illustrating a modified example of the electronic component storage substrate with respect to the sixth embodiment as illustrated in FIGS. 7A to 7C, in which the bottom surface of the substrate is curved in a convex shape; FIG. 12B is a cross-sectional view taken along line X-X of FIG. 12A.

FIG. 13A1 to 13B2 are schematic views illustrating a manufacturing method for an electronic component storage substrate according to the first embodiment.

FIGS. 14C1 and 14C2 are schematic views illustrating a manufacturing method subsequent to that of FIG. 13B2.

FIG. 15 is a schematic cross-sectional view in which a maternal molded body configured to serve as the electronic component storage substrate(s) of the sixth to ninth embodiments is press-molded.

DESCRIPTION OF EMBODIMENTS

Figure 1A:
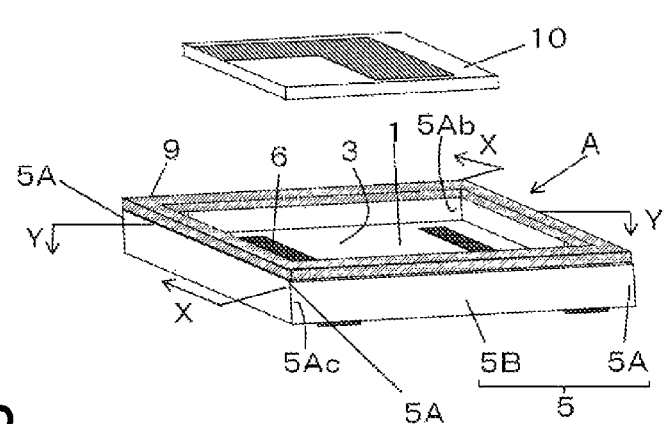
FIGS. 1A and 1B are exploded perspective views illustrating an electronic component housing package according to a first embodiment.

Often, in conventional electronic component storage substrates 101 such as those illustrated in FIGS. 16A to 17B, efforts to further miniaturize electronic storage substrates 101 can result in the thickness t of the substrate bank section 109 being decreased. Accordingly, this may reduce the mechanical strength of the substrate bank section 109. As a result, when seam welding is performed to bond the lid 113 to the substrate bank section 109, the heating and cooling of the seam welding process can apply thermal stress to the substrate bank section 109 and the metal layer 111. As this thermal stress builds, particularly, at the corner portion 107 of the substrate bank section 109, the likelihood of cracks 115 forming in the vicinity of the corner portion 107 on the top surface of the substrate bank section 109 where the lid 113 is bonded may increase.

In the conventional electronic component storage substrates illustrated in FIGS. 16A to 17B, the top surface 107a of the corner portion 107 of the substrate bank section 109 is flat with respect to the thickness direction. Additionally, the thickness $t_m$ of the metal layer 111 is also substantially the same in the height direction as that of the substrate bank section 109. When the cross-sections of both the upper surface 107a of the corner portion 107 of the substrate bank section 109 and the metal layer 111 have such a shape, the lid 113 may be bonded to substantially the entire surface of the front surface 111a of the metal layer 111. As such, the size of the bonding surface area between the lid 113 and the metal layer 111 may be increased. When the bonding surface area between the lid 113 and the metal layer 111 is substantially large, the metal layer 111 may become more susceptible to the contractive force of the lid 113 when heating from processes such as seam welding are performed. As a result, cracks 115 may form on the top surface 107a of the corner portion 107 due to the metal layer 111, such that the likelihood of breakage increases.

In contrast, aspects of the embodiments described herein relate to providing an electronic component storage substrate for mitigating crack formation in the vicinity of the corners on the top side of the substrate bank section, as well as an electronic component housing package configured for housing thereof.

Figure 1B:
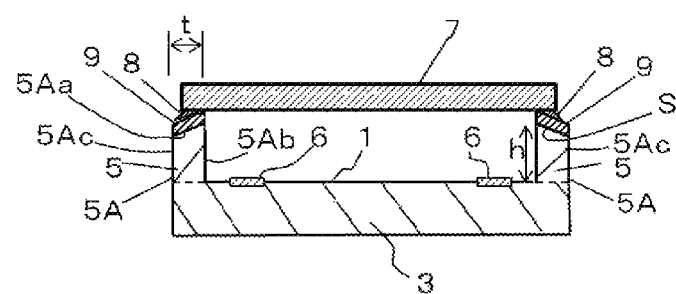
Figure 2A:
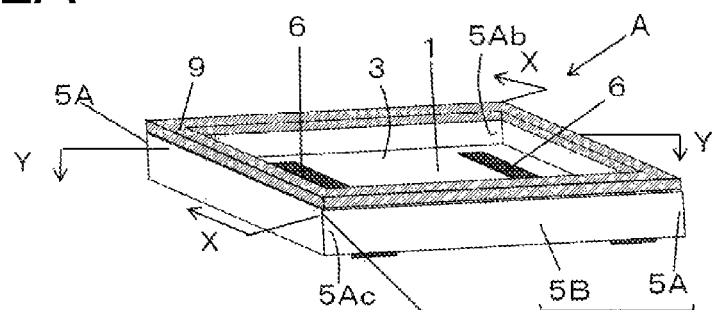
FIG. 2A is a schematic perspective view illustrating the electronic component storage substrate according to the first embodiment.
Figure 2B:
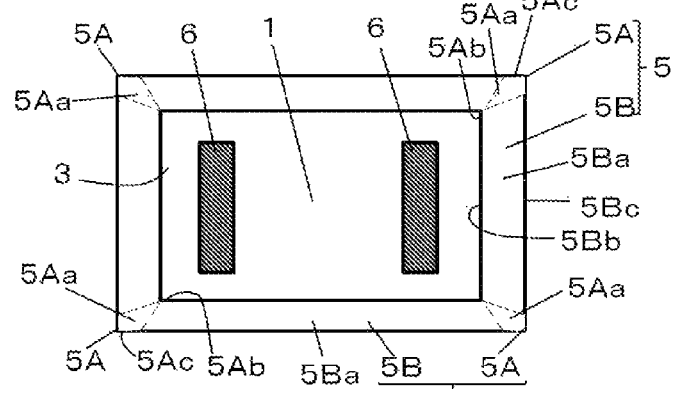
FIG. 2B is a plan view of the electronic component storage substrate illustrated in FIG. 2A as seen from the position of the line Y-Y.
Figure 2C:
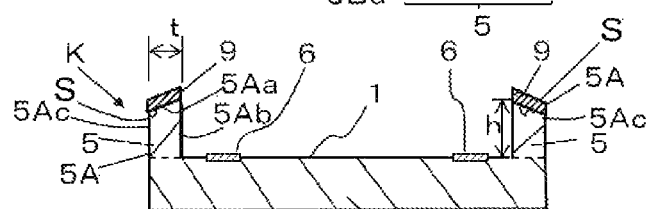
FIG. 2C is a cross-sectional view taken along the line X-X of FIG. 2A.
Figure 2D:
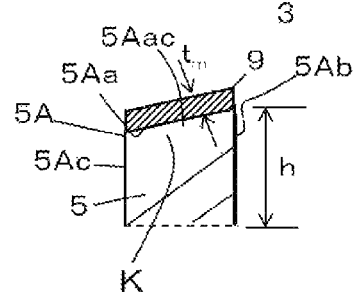
FIG. 2D is an enlarged view of the K-portion illustrated in FIG. 2C.

FIGS. 1A and 1B are exploded perspective views illustrating an electronic component housing package according to a first embodiment; FIG. 1B illustrates a cross-sectional view taken along line X-X of FIG. 1A. FIG. 2A is a schematic perspective view illustrating the electronic component storage substrate according to the first embodiment; FIG. 2B is a plan view of the electronic component storage substrate illustrated in FIG. 2A as seen from the position of the line Y-Y; FIG. 2C is a cross-sectional view taken along the line X-X of FIG. 2A; and FIG. 2D is an enlarged view of the K-portion illustrated in FIG. 2C.

A first embodiment of the electronic component storage substrate A includes a plate-shaped substrate 3 having a mounting surface 1 (main surface) for electronic components 10 as well as a substrate bank section 5 provided on the substrate 3 so as to enclose the mounting surface 1. The substrate bank section 5 may be configured in a rectangular frame-shape having 4 corner portions 5A. Herein, the corner portion 5A of the substrate bank section 5 refers to the area marked on the diagonal point in the rectangular frame-shaped substrate bank section 5 (the rhombic area of FIG. 2B), and the side portion 5B refers to the area excluding the rhombic section. Also, a metal layer 9 for bonding a lid 7 or other metal material is provided around the circumference on the front surface of the substrate bank section 5. In such a configuration, the lid 7 may be joined to the metal layer 9 using a bonding material 8 such as silver solder. Further, a surface electrical conductor layer 6 may be provided on the mounting surface 1 of the substrate 3 in order to accommodate the electrical components 10. Herein, the top surface 5Aa of the corner portion 5A on the substrate bank section 5 has an inclined portion S that is slanted downward toward the outside from the inner surface 5Ab toward the outer surface 5Ac.

Note that the top surface 5Ba of the side portion 5B (that excludes the corner portions 5A of the substrate bank section 5) is substantially parallel to the mounting surface 1. Also, the thickness $t_m$ of the metal layer 9 provided on the top surface 5Aa of the corner portion 5A and the top surface 5Ba of the side portion 5B may be substantially the same from the inner surface 5Ab to the outer surface 5Ac and from the inner surface 5Bb to the outer surface 5Bc. In such a configuration, the variation in the thickness $t_m$ of the metal layer 9 from the inner surface 5Ab of the corner portion 5A to the outer surface 5Ac may be 2 μm or less.

According to a first embodiment of the electronic component storage substrate A, the top surfaces 5Aa of the four corner portions 5A of the substrate bank section 5 may be slanted so as to decrease in height from the inner surface 5Ab to the outer surface 5Ac, such that the lid 7 can be bonded to the metal layer 9 at the corner portion 5A of the substrate bank section 5 at a location where the height h of the inner surface 5Ab is substantially tall.

As a result, by reducing the bonding surface area between the lid 7 and the metal layer 9, the impact of the contractive force exerted by the metal layer 9 provided on the outer surface 5Ac of the corner portion 5A may be mitigated. As an example, in a case where seam welding is performed to bond the lid 7 to the substrate bank section 5 via the metal layer 9, it is possible to prevent breakage caused by peeling of the metal layer 9 from the top surface 5a of the substrate bank section 5 as the metal layer 9 shrinks from the heat. In this case, it is desirable for the region where the lid 7 is bonded to the metal layer 9 to be in the range of ¾ or less of the thickness t from the inner surface 5Ab and the inner surface 5Bb of the substrate bank section 5.

Figure 3:
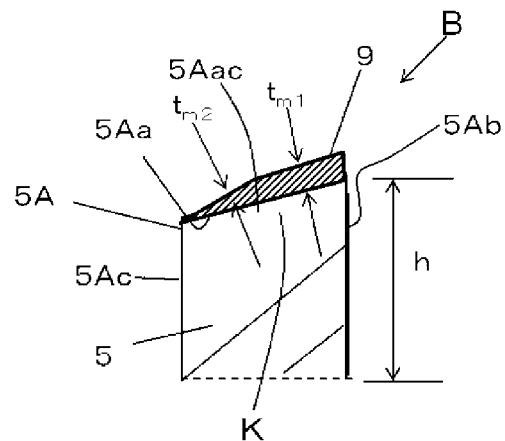
FIG. 3 is a schematic cross-sectional view partially illustrating an electronic component storage substrate according to a second embodiment.

FIG. 3 is a schematic cross-sectional view partially illustrating an electronic component storage substrate according to a second embodiment. One difference between the electronic component storage substrate B of the second embodiment and the electronic component storage substrate A of the first embodiment illustrated in FIGS. 2A to 2D is the differing cross-sectional shape of the metal layer 9 provided on the top surface 5Aa of the substrate bank section 5. More particularly, in the electronic component storage substrate B of the second embodiment, the thickness $t_m$ of the metal layer 9 provided on the substrate bank section 5 decreases (e.g., becomes thinner) from the inner surface 5Ab to the outer surface 5Ac; as illustrated in FIG. 3, the thickness $t_m$ is described by the relationship $t_{m1} > t_{m2}$.

In such a configuration, as the cross-section of the metal layer 9 tapers from the center portion 5Aac of the top surface 5Aa of the corner portion 5A to the outer surface 5Ac, the stress applied to the substrate bank section 5 due to shrinkage of the metal layer 9 is reduced, and breakage as a result of peeling of the metal layer 9 can be mitigated.

Figure 4:
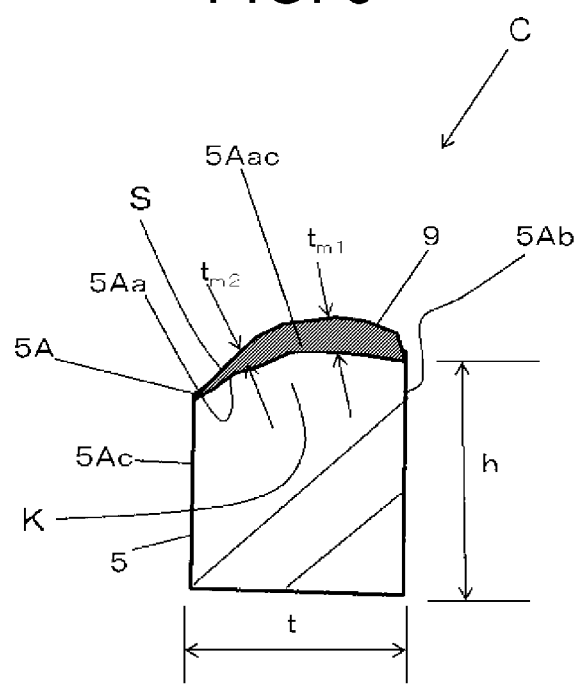
FIG. 4 is a schematic cross-sectional view partially illustrating an electronic component storage substrate according to a third embodiment.

FIG. 4 is a schematic cross-sectional view partially illustrating an electronic component storage substrate according to a third embodiment. One difference between the electronic component storage substrate C of the third embodiment and the electronic component storage substrates A and B of the first and second embodiments illustrated in FIGS. 2A to 2D and FIG. 3 is the shape of the K-portion illustrated in FIG. 2C. More particularly, in the electronic component storage substrate C of the third embodiment, the top surface 5Aa of the corner portion 5A of the substrate bank section 5 forms a curved surface convexed upward.

When the top surface 5Aa of the corner portion 5A of the substrate bank section 5 is configured as an upwardly convex curved surface, the top surface 5Aa of the corner portion 5A may be configured such that the center portion 5Aac of the thickness direction indicated by reference symbol t forms a steeply inclined shape with respect to the outer surface 5Ac. As such, the thickness $t_m$ of the metal layer 9 provided on the top surface 5Aa of the corner portion 5A may be reduced (e.g., made thinner) from the center portion 5Aac of the top surface 5Aa to the outer surface 5Ac, such that the area of the metal layer 9 having a substantially low thickness $t_m$ can be increased.

Similarly, to the electronic component storage substrate B of the second embodiment illustrated in FIG. 3, the thickness $t_m$ of the metal layer 9 provided on the substrate bank section 5 decreases (e.g., becomes thinner) from the inner surface 5Ab to the outer surface 5Ac; as illustrated in FIG. 4, the thickness $t_m$ is described by the relationship $t_{m1} > t_{m2}$.

As the cross-section of the metal layer 9 tapers from the center portion 5Aac of the top surface 5Aa of the corner portion 5A to the outer surface 5Ac, the stress applied to the substrate bank section 5 due to shrinkage of the metal layer 9 is reduced, and breakage as a result of peeling of the metal layer 9 can be mitigated.

In addition, as the metal layer 9 that covers the top surface 5Aa of the substrate bank section 5 can also be configured to extend from the top surface 5Aa of the substrate bank section 5 that serves as the inclined portion S to the outer surface 5Ac to which it is connected, it is possible to increase the surface area of the metal layer 9 on the top surface 5Aa of the substrate bank section 5. As such, the size of the bonding surface area between the metal layer 9 formed on the top surface 5Aa of the substrate bank section 5 and the lid 7 may be increased. As a result, the seal effectiveness between the substrate bank section 5 and the lid 7 may be strengthened, and the airtightness of the electronic component housing package may be improved.

Figure 5:
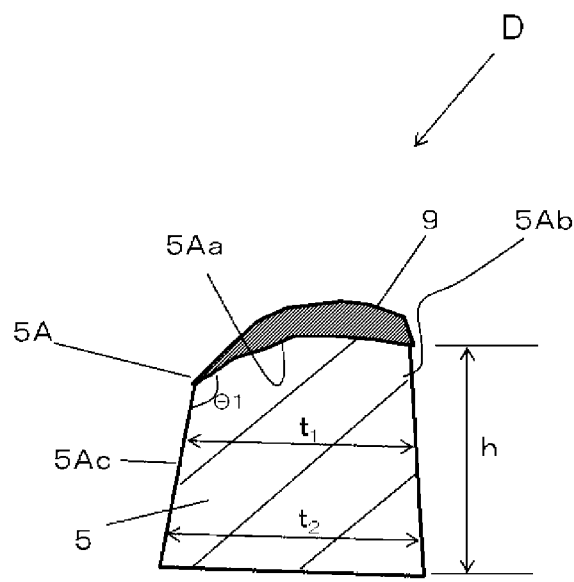
FIG. 5 is a schematic cross-sectional view partially illustrating an electronic component storage substrate according to a fourth embodiment.

FIG. 5 is a schematic cross-sectional view partially illustrating an electronic component storage substrate according to a fourth embodiment of. One difference between the electronic component storage substrate D of the fourth embodiment and the electronic component storage substrates A, B, and C of the first to third embodiments illustrated in FIGS. 2A to 2D, FIG. 3, and FIG. 4, is the differing shape of the cross section of the corner portion 5A of the substrate bank section 5. More particularly, in the electronic component storage substrate D of the fourth embodiment, the thickness t of the substrate bank section 5 increases (e.g., becomes thicker) from the top surface 5Aa toward the mounting surface 1. Put differently, the thickness t of the cross section of the corner portion 5A of the substrate bank section 5 becomes wider from the top surface 5Aa toward the mounting surface 1, and, as illustrated in FIG. 5, the thickness t of the cross section of the corner portion 5A of the substrate bank section is described by the relationship $t_1 < t_2$.

When the thickness t of the cross section of the corner portion 5A of the substrate bank section 5 is configured to become thicker from the top surface 5Aa toward the mounting surface 1, the angle $\theta_1$ formed by the top surface 5Aa and the outer surface 5Ac of the corner portion 5A of the substrate bank section 5 becomes large and the slope of the inclined surface becomes more gentle, such that the metal layer 9 tends to spread out thinly from the top surface 5Aa of the corner portion 5A to the outer surface 5Ac. As a result, the area over which the metal layer 9 is thinly spread increases in size, the stress exerted on the substrate bank section 5 due to the contractive force of the metal layer 9 can be further reduced, and breakage of the substrate bank section 5 as a result of peeling of the metal layer 9 can be further mitigated.

Figure 6:
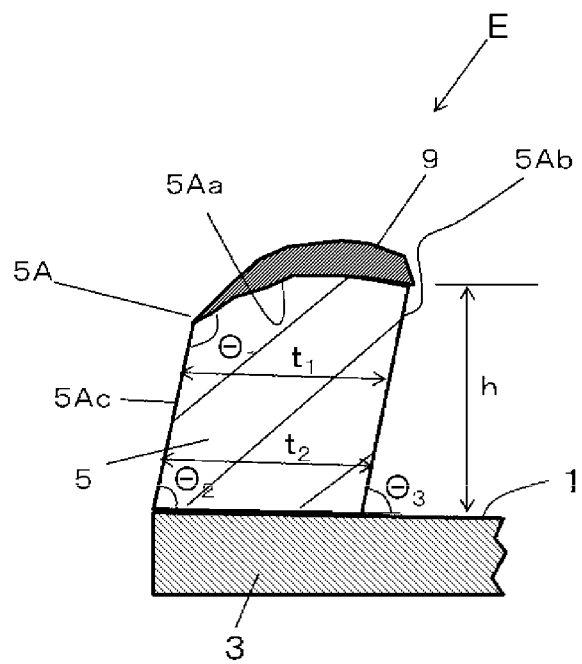
FIG. 6 is a schematic cross-sectional view partially illustrating an electronic component storage substrate according to a fifth embodiment.

FIG. 6 is a schematic cross-sectional view partially illustrating an electronic component storage substrate according to a fifth embodiment. One difference between the electronic component storage substrate E of the fifth embodiment and the electronic component storage substrates A, B, C and D of the first to fourth embodiments illustrated in FIGS. 2A to 2D, FIG. 3, FIG. 4, and FIG. 5, is that both the inner surface 5Ab of the substrate bank section 5 and the outer surface 5Ac are slanted toward the mounting surface 1, and form acute angles. Put differently, in the electronic component storage substrate E of the fifth embodiment, the angle $\theta_2$ formed between the outer surface 5Ac of the substrate bank section 5 and the mounting surface 1 as well as the angle $\theta_3$ formed between the inner surface 5Ab and the mounting surface 1 are both less than 90°.

Similarly, to the electronic component storage substrate D of the fourth embodiment illustrated in FIG. 5, the angle $\theta_1$ formed between the outer surface 5Ac of the corner portion 5A of the substrate bank section 5 and the top surface 5Aa becomes large, such that the metal layer 9 may easily spread out from the top surface 5Aa of the corner portion 5A to the outer surface 5Ac. As a result, the contractive force of the metal layer 9 can be reduced, such that breakage of the substrate bank section 5 due to peeling of the metal layer 9 can be further mitigated.

In such a configuration, with respect to the electronic component storage substrate E of the fifth embodiment, it is desirable for the difference between the thickness $t_1$ of the top surface 5Aa of the substrate bank section 5 and the thickness $t_2$ of the mounting surface 1 to be within 10 µm. If the thickness $t_1$ of the top surface 5Aa of the substrate bank section 5 and the thickness $t_2$ of the mounting surface 1 are substantially equal, the thickness t of the substrate bank section 5 (represented by thicknesses $t_1$, $t_2$ in FIG. 5) can be further reduced such that, in configurations in which the maximum dimensions of the electronic component storage substrate E are stipulated, the surface area of the mounting surface 1 may be enlarged. Accordingly, higher performance electronic components 10 can be mounted, and the overall performance of the electronic component housing package may be improved.

In addition, with respect to the electronic component storage substrate of the present embodiment, configurations that make use of an inclined surface on the substrate side are also possible.

Figure 7A:
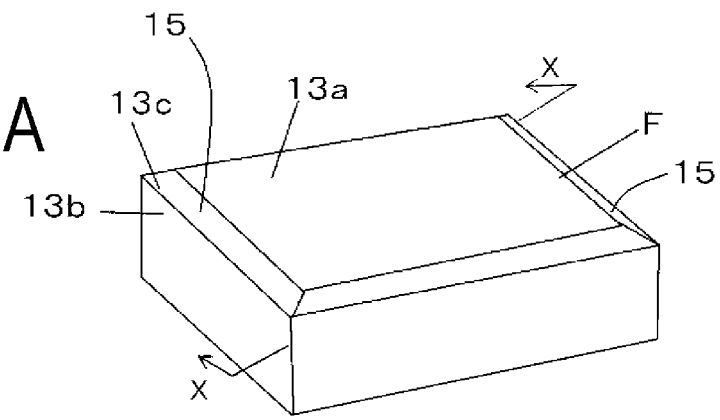
FIG. 7A is a perspective view of an electronic component storage substrate according to a sixth embodiment as viewed from a bottom surface of the substrate, wherein a connecting surface connecting the bottom surface and a side surface of the substrate is formed between the bottom surface and the side surface so as to form an inclined surface.
Figure 7B:
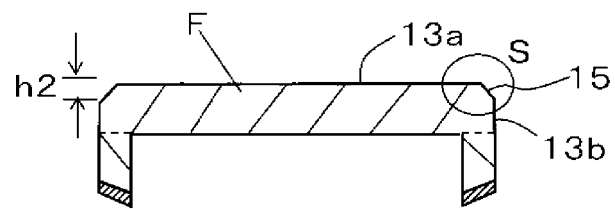
FIG. 7B illustrates a cross-sectional view taken along line X-X in FIG. 7A.
Figure 7C:
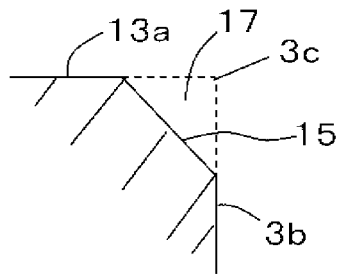
FIG. 7C is an enlarged view of the S-portion illustrated in FIG. 7B.

FIG. 7A is a perspective view of an electronic component storage substrate according to a sixth embodiment as viewed from a bottom surface of the substrate, wherein a connecting surface connecting the bottom surface and a side surface of the substrate is formed between the bottom surface and the side surface so as to form an inclined plane. FIG. 7B illustrates a cross-sectional view taken along line X-X in FIG. 7A. FIG. 7C is an enlarged view of the S-portion illustrated in FIG. 7B.

Figure 8A:
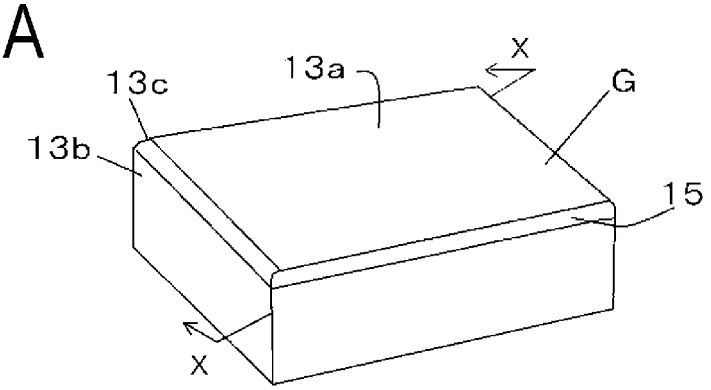
FIG. 8A is a perspective view of an electronic component storage substrate according to a seventh embodiment as viewed from a bottom surface of the substrate, wherein a connecting surface connecting the bottom surface and a side surface of the substrate is formed between the bottom surface and the side surface so as to form a convex curved surface.
Figure 8B:
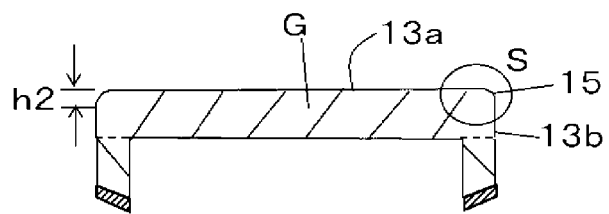
FIG. 8B illustrates a cross-sectional view taken along line X-X in FIG. 8A.
Figure 8C:
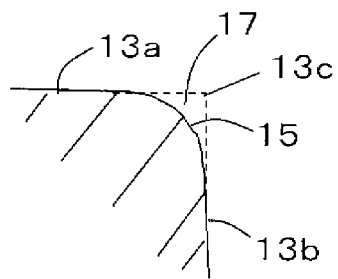
FIG. 8C is an enlarged view of the S-portion illustrated in FIG. 8B.

FIG. 8A is a perspective view of an electronic component storage substrate according to a seventh embodiment as viewed from a bottom surface of the substrate, wherein a connecting surface connecting the bottom surface and a side surface of the substrate is formed between the bottom surface and the side surface so as to form a convex surface. FIG. 8B illustrates a cross-sectional view taken along line X-X in FIG. 8A. FIG. 8C is an enlarged view of the S-portion illustrated in FIG. 8B.

Figure 9A:
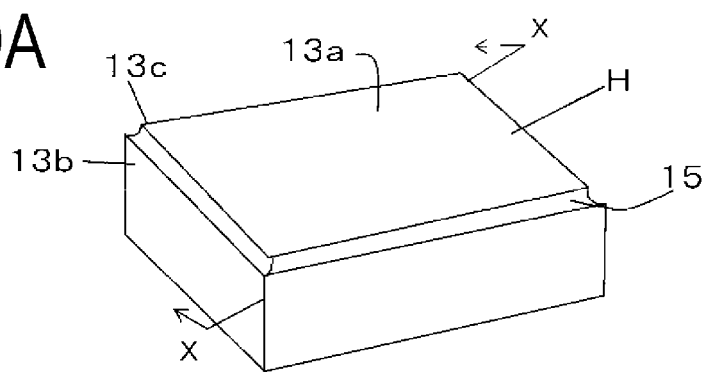
FIG. 9A is a perspective view of an electronic component storage substrate according to an eighth embodiment as viewed from a bottom surface of the substrate, wherein a connecting surface connecting the bottom surface and a side surface of the substrate is formed between the bottom surface and the side surface so as to form a concave surface.
Figure 9B:
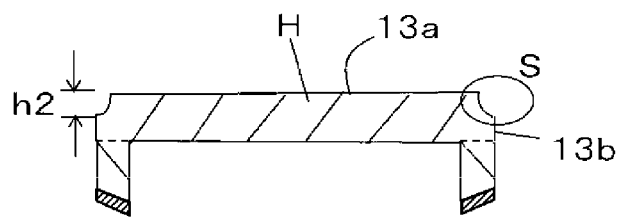
FIG. 9B illustrates a cross-sectional view taken along line X-X in FIG. 9A.
Figure 9C:
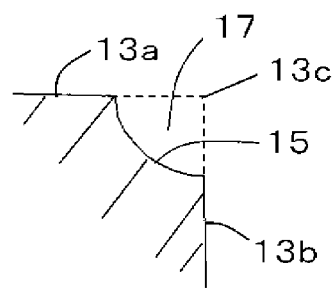
FIG. 9C is an enlarged view of the S-portion illustrated in FIG. 9B.

FIG. 9A is a perspective view of an electronic component storage substrate according to an eighth embodiment as viewed from a bottom surface of the substrate, wherein a connecting surface connecting the bottom surface and a side surface of the substrate is formed between the bottom surface and the side surface so as to form a concave surface. FIG. 9B illustrates a cross-sectional view taken along line X-X in FIG. 9A. FIG. 9C is an enlarged view of the S-portion illustrated in FIG. 9B.

Figure 10A:
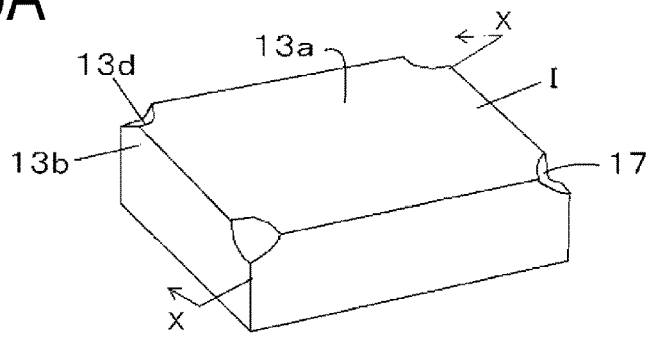
FIG. 10A is a perspective view of an electronic component storage substrate according to a ninth embodiment as viewed from a bottom surface of the substrate, wherein a connecting surface is provided at a corner of the bottom surface where the bottom surface of the substrate and two side surfaces intersect.
Figure 10B:
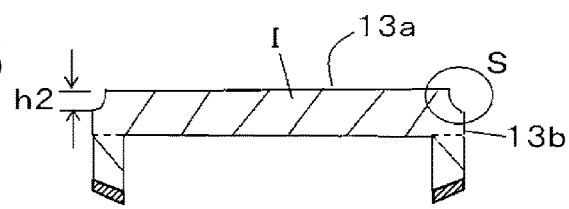
FIG. 10B illustrates a cross-sectional view taken along line X-X in FIG. 10A.
Figure 10C:
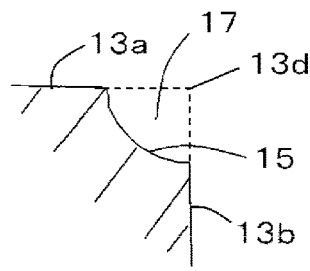
FIG. 10C is an enlarged view of the S-portion illustrated in FIG. 10B.

FIG. 10A is a perspective view of an electronic component storage substrate according to a ninth embodiment as viewed from a bottom surface of the substrate, wherein a connecting surface is provided at a corner of the bottom surface where the bottom surface of the substrate and two side surfaces intersect. FIG. 10B illustrates a cross-sectional view taken along line X-X in FIG. 10A. FIG. 10C is an enlarged view of the S-portion illustrated in FIG. 10B.

In the electronic component storage substrates of the sixth to ninth embodiments illustrated in FIGS. 7A to 10C, the ridge portion 13c that connects the bottom surface 13a of the substrate 3 and the side surface 13b that is the surface substantially perpendicular to the bottom surface 13a may serve as a connecting surface 15 which is notched and inclined.

In particular, with respect to the electronic component storage substrate F of the sixth embodiment illustrated in FIGS. 7A to 7C, the inclined connecting surface 15 may be configured to form a flat surface. With respect to the electronic component storage substrate G of the seventh embodiment illustrated in FIGS. 8A to 8C, the inclined connecting surface 15 may be configured to form a convex surface. With respect to the electronic component storage substrate H of the eighth embodiment illustrated in FIGS. 9A to 9C, the inclined connecting surface 15 may be configured to form a concave surface. With respect to the electronic component storage substrate I of the ninth embodiment illustrated in FIGS. 10A to 10C, a connecting surface 15 may be provided at a corner 13d of the bottom surface 13a where the bottom surface 13a and the two side surfaces 13b of the substrate 3 intersect. Although the connecting surface 15 is illustrated as a concave surface in FIGS. 10A to 10C, configurations in which it is structured as a flat surface or a convex surface are also possible.

According to the electronic component storage substrates F through I of the sixth to ninth embodiments described herein, in the configuration in which the ridge portion 13 connects the bottom surface 13a and the side surface 13b of the substrate 3, the ridge portion 13c and the corner 13d (illustrated in FIG. 10A) need no longer be formed in a protruding shape, such that the ridge portion 13c and the corner 13d can be made to further resist chipping. Additionally, it is possible to mitigate the occurrence of cracks caused by the chipping of the ridge portion 13c and the corner 13d. In such a configuration, it is desirable for the height h2 of this portion of the connecting surface 15 be ⅓ or less of the overall thickness of the substrate.

Figure 11A:
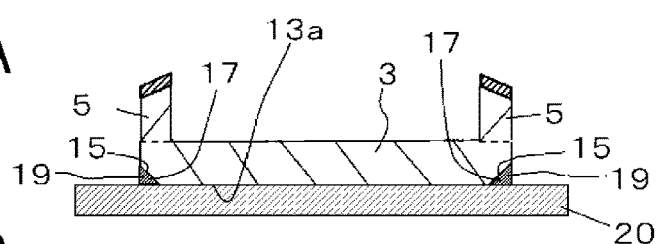
FIG. 11A is a perspective view illustrating a modified example of the electronic component storage substrate of the sixth embodiment illustrated in FIGS. 7A to 7C, in which the bottom surface of the substrate is curved in a convex shape.
Figure 11B:
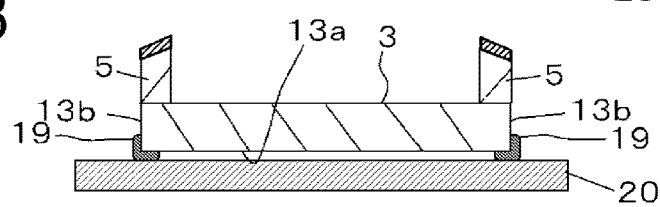
FIG. 11B is a cross-sectional view taken along line X-X of FIG. 11A.
Figure 11C:
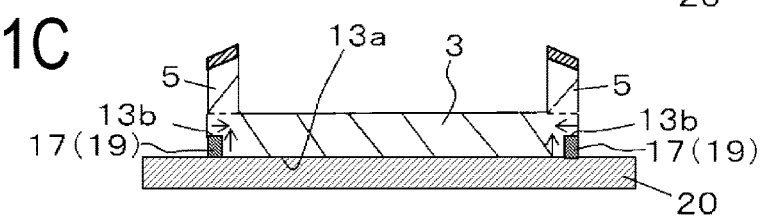
FIG. 11C illustrates a configuration of the substrate that does not include a notch.

FIG. 11A is a cross-sectional view illustrating a configuration in which the electronic component storage substrate of the sixth embodiment is mounted on a motherboard. FIGS. 11B and 11B are illustrated for purposes of comparison with FIG. 11A, and FIG. 11B illustrates a configuration in which the substrate does not include a notch. FIG. 11C illustrates a configuration in which the notch in the substrate forms a perpendicular shape from a cross-sectional view.

FIG. 11A illustrates an electronic component storage substrate F according to a sixth embodiment, in which a bonding material 19 is provided in a portion of the notch 17 formed between the side surface 13b and the bottom surface 13a of the substrate 3. The electronic component storage substrate F may be joined to the motherboard 20 via the bonding material 19. The bonding material 19 may be deposited in a portion of the notch 17 of the electronic component storage substrate F. As such, in contrast to electronic component storage substrates such as those illustrated in FIG. 11B, for example, the substrate 3 have no notches 17. Thus, it is possible to limit the mounting height of the motherboard 20. In addition, it is possible to reduce the amount of bonding material 19 that protrudes outward from the side surface 13b of the substrate 3. Accordingly, it is possible to reduce the space between the upper and lower sides as well as the left and right sides of the housed components on the motherboard 20 that includes the electronic component storage substrate F, such that component housing density may be improved.

Further, with respect to the electronic component storage substrate F of the sixth embodiment, as the notch 17 is shaped to form the inclined connecting surface 15, even if the thermal expansion coefficients of the bonding material 19 and the substrate 3 differ, the stress concentrated near the inclined connecting surface 15 of the substrate 3 with which the bonding material 19 interfaces can be mitigated. As such, it is possible to impede the occurrence of cracks in the portion of the substrate 3 where the bonding material 19 is deposited.

Hereinafter, the features of the electronic component storage substrate F according to the sixth embodiment will be described in comparison with FIG. 11C. With respect to the electronic component storage substrate F according to the sixth embodiment illustrated in FIG. 11A, the shape of the notch 17 when the substrate 3 is viewed in cross section constitutes the inclined connecting surface 15 between the bottom surface 13a of the substrate 3 and the side surface 13b. In contrast, when the substrate 3 is viewed in cross section, the notch 17 of the electronic component storage substrate illustrated in FIG. 11C constitutes a rectangular shape, in which the plane parallel to the bottom surface 13a and the plane parallel to the side surface 13b of the substrate 3 intersect at right angles (e.g., perpendicularly). When the of the notch 17 is rectangular when the substrate 3 is viewed in cross section, the stress from the direction parallel to the bottom surface 13a and the direction parallel to the side surface 13b of the substrate 3 may tend to be concentrated in the vicinity of the bonding material 19 deposited on the substrate 3. As a result, cracks may tend to form in the vicinity of the bonding material 19 of the substrate 3 where the stress is concentrated. In FIG. 11C, the perpendicular arrows indicate the concentration of stress.

In contrast, in the electronic component storage substrate F of the sixth embodiment illustrated in FIG. 11A, as described herein, the shape of the notch 17 when the substrate 3 is viewed in cross section constitutes the inclined connecting surface 15 between the bottom surface 13a and the side surface 13b of the substrate 3. As such, in the electronic component storage substrate F of the sixth embodiment, the stress concentration illustrated in FIG. 11C can be mitigated such that the probability of cracks forming on the bottom surface 13a of the substrate 3 can be decreased. Thus, according to the electronic component storage substrates F through I of the sixth to ninth embodiments, the reliability of secondary mounting operations may be increased.

Note that the benefits described herein with respect to the electronic component storage substrate F of the sixth embodiment are not limited therein, and the same or similar benefits may be obtained using electronic component storage substrates G through I of the seventh to ninth embodiments.

FIG. 12A is a perspective view illustrating a modified example of the electronic component storage substrate with respect to the sixth embodiment as illustrated in FIGS. 7A to 7C, in which the bottom surface of the substrate is curved in a convex shape; FIG. 12B is a cross-sectional view taken along line X-X of FIG. 12A. For the sake of convenience, the electronic component storage substrate illustrated in FIGS. 12A to 12B shall be referred to as electronic component storage substrate J according to a tenth embodiment.

Further, as illustrated in FIGS. 12A and 12B, the electronic component storage substrates F through I described herein may be configured such that the bottom surface 13a is curved in a convex shape. In configurations where the shape of the notch 17 when the substrate 3 is viewed in cross section constitutes an inclined connecting surface 15 between the bottom surface 13a and the side surface 13b of the substrate 3, as the bonding material 19 may be deposited in a portion of the notch 17, even if the bottom surface 13a of the electronic component storage substrate is curved in a convex shape, the mounting height of the motherboard 20 may be limited.

The electronic component storage substrates A through J described herein (hereinafter, sometimes denoted only by reference symbol A) may be suitable for use with small-sized components, such as those having a substrate bank section 5 with average thickness t (thickness at the position of the top surface 5a) of 0.05 to 0.15 mm, substrates 3 having an area of 0.5 to 5 mm$^2$, and substrates 3 having an average thickness of 0.05 to 1 mm.

With regard to the insulating material that constitutes the electronic component storage substrate A, a ceramic material is desirable in view of being able to provide a high level of mechanical strength in a small, thin form-factor. In such a configuration, in view of its high thermal conductivity and strength, it is desirable that an alumina including additives such as Si and Mg is utilized as the primary component.

It is desirable for the metal layer 9 to be a metalized film formed by printing and simultaneously sintering a metal powder paste on the surface of the ceramic powder compact that comprises the substrate bank section 5. The conductor layer 6 for mounting the electronic components 10 may be formed in substantially the same fashion. This is because, when the substrate bank section 5 is made of ceramic and the metalization film described above is formed thereon as the metal layer 9, the voids formed in the metal layer 9 or the interface between the substrate bank section 5 and the metal layer 9 can be decreased in size. Accordingly, the seal effectiveness between the substrate bank section 5 and the lid 7 may be improved.

Further, it is desirable for the substrate 3 and the substrate bank section 5 to be formed together as one unit by sintering. When the substrate 3 and the substrate bank section 5 are formed together as one unit, the seal effectiveness as the bonding interface can be increased.

Also, it is preferable for the substrate 3 and the substrate bank section 5 to be composed of the same material. When the substrate 3 and the substrate bank section 5 are composed of the same material, the sintering speeds of the substrate 3 and the substrate bank section 5 at the time of sintering are substantially similar, such that warpage and deformation of the electronic component storage substrate A may be reduced. For example, as it is possible to reduce deformation upon joining of the lid 7, the residual stress generated by deformation is also lowered, such that even when exposed to environments prone to sudden temperature change, the formation of defects such as cracks in the substrate bank section 5 of the substrate 3 can be suppressed. Herein, the expression "same material" indicates that the ceramic elements of the primary components included in the substrate 3 and the substrate bank section 5 are substantially the same/similar. In this case, the primary component refers to a configuration in which the content of the ceramic elements included in the substrate 3 and the substrate bank section 5 is 80 mass % or greater.

The electronic component housing package of the present embodiment may be configured such that the mounting surface 1 of the electronic component storage substrate A houses an electronic component 10 such as a crystal resonator, and a lid 7 is provided on the upper portion of the substrate bank section 5.

With regard to the electronic component housing package, similar to the electronic component storage substrate A described above, even in the event that the metal layer 9 formed on the top surface 5Aa of the substrate bank section 5 shrinks due to heat, breakage of the portion of the top surface 5Aa of the substrate bank section 5 as a result of peeling of the metal layer 9 can be mitigated. Also, as the seal effectiveness between the substrate bank section 5 and the lid 7 can be increased, it is possible to obtain an electronic component housing package with a high level of air tightness. Note that, by utilizing one or more of the electronic component storage substrates F to J of the sixth to ninth embodiments as the electronic component storage substrate, it is possible to attain a configuration that has a high level of reliability for secondary mounting operations in addition to improved seal effectiveness.

Next, a manufacturing method for the above-described electronic component storage substrate A and the electronic component housing package for mounting thereof will be described by way of example.

FIGS. 13A1 to 13B2 are schematic views illustrating a manufacturing method for an electronic component storage substrate according to the first embodiment. FIGS. 14C1 and 14C2 are schematic views illustrating a manufacturing method subsequent to that of FIG. 13B2. Herein, FIGS. 13A1, 13B1, and 14C1 illustrate cross-sectional views of the components utilized in each respective processing step, and FIGS. 13A2, 13B2, and 14C2 represent plan views.

Firstly, as illustrated in FIGS. 13A1 and 13A2, a sheet formed body 21 for forming the substrate 3 and the substrate bank section 5 is produced. With regard to the composition, a mixed powder primarily composed of $Al_2O_3$ powder to which a predetermined amount of $SiO_2$ powder and MgO powder is added may be used.

Next, an organic binder is added to the mixed powder together with a solvent to prepare a slurry or kneaded material which is then formed into the sheet formed body 21 using a molding method such as a pressing method, a doctor-blade method, a rolling method, or an injection method.

Next, as illustrated in FIGS. 13B1 and 13B2, a metal mold 23 having both a protruding portion 23a and a small protruding portion 23b on one surface is prepared, and the metal mold 23 is utilized to press-mold the sheet formed body 21. In such a configuration, the portion corresponding to the protruding portion 23a of the metal mold 23 may become the recessed portion 25a of the maternal molded body 25 described herein. The convex portion 25b (forming the substrate bank section 5) of the maternal molded body 25 is formed in the maternal molded body 25 so as to surround the adjacent recessed portion 25a like a fence. A portion corresponding to the small protruding portion 23b between the protruding portions 23a may become a recessed portion 25c formed on the convex portion 25b. In this manufacturing method for the electronic component storage substrate A, it is possible to form the recessed portion 25c in one of a variety of shapes by changing the shape of the small protruding portion 23b adjacent to the metal mold 23. In addition, when a metal mold 23 that does not include small protruding portions 23b is used, it is possible to form the maternal molded body 25 into a similar shape by adjusting the vacuum degree at the time that press-molding is performed. Particularly, this may be accomplished by reducing the vacuum degree within the metal mold 23 during the second half of the press-molding process with respect to the first half. As such, as air remains in the metal mold 23 during press-molding, the air flows to the upper end of the convex portion 25b (the portion that will become the substrate bank section 5 after firing) which occupies a relatively high position in the maternal molded body 25. As a result, the recessed portion 25c may be formed on the top surface of the convex portion 25b.

Next, the metal powder paste printing pattern 29 may be formed on the top surface of the convex portion 25b that includes the recessed portion 25c of the maternal molded body 25. Also, the printing pattern 29 that will become the surface electrical conductor layer 6 may be formed on the region that will become the mounting surface 1 after firing. In addition to customary printing methods, it is also possible to create the printing pattern 29 of the metal powder paste by transferring the printing pattern 29 formed on the base member to the convex portion 25b that includes the recessed portion 25c of the concave shaped body 27. In such a configuration, it is desirable to utilize a metal powder paste having a high degree of Newtonian flowability such that it may spread out evenly and thinly to reduce the thickness of the end portions of the printing pattern 29. As one method of making the viscosity of the metal powder paste have a substantially high level of Newtonian flowability, it is desirable to increase the amount of solvent contained in the metal powder paste. For instance, it is preferable to use one or more of an Mo powder, a W powder, or a mixed powder thereof with respect to the metal powder paste.

Next, the previously-manufactured maternal molded body 25 may be cut along the cutting line Sc to form a concave shaped body 27. For example, as illustrated in FIG. 14C1, the inclined portion 25d of the convex portion 25b formed on the concave shaped body 27 is derived from the recessed portion 25c formed on the maternal molded body 25.

Subsequently, by firing the concave shaped body 27 according to a predetermined temperature criterion, the electronic component storage substrate A can be formed. In particular, when forming the electronic component storage substrate E of the fifth embodiment as depicted illustrated in FIG. 6, by firing at a temperature from 20 to 30° C. higher than that used when manufacturing the electronic component storage substrate A of the first embodiment from the concave shaped body 27, a sintered compact having a high firing-shrinkage probability may be obtained.

When forming electronic component storage substrates F to I of the sixth to ninth embodiments, as illustrated in FIG. 15, it is desirable to utilize a metal mold 24 having a projecting portion 24b on the bottom surface 24 of the lower metal mold 24a where the sheet formed body 21 is to be placed. Herein, the base mold 25 that constitutes the electronic component storage substrates F to I of the sixth to ninth embodiments may be manufactured based on the shape of the projecting portion 24a formed on the lower mold 24A. Also, as illustrated in FIG. 15, it is desirable to utilize a lower mold 24A having a concave bottom surface when manufacturing the maternal molded body 25 that constitutes the electronic component storage substrate J of the tenth embodiment.

EXAMPLES

Example 1

After mixing according to the ratio of 5 mass % $SiO_2$ powder and 2 mass % MgO powder with respect to 93 mass % $Al_2O_3$ powder, 19 mass % of an acrylic binder (as an organic binder) and toluene as an organic solvent were mixed to prepare a slurry, and a sheet formed body with an average thickness of 400 μm was produced by a doctor blade method.

Figure 16A:
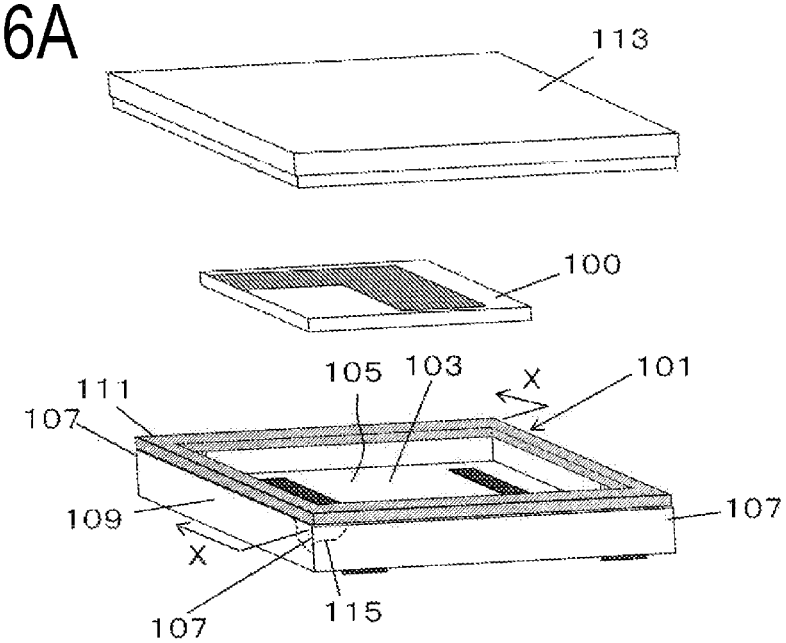
FIG. 16A is an exploded perspective view of a conventional electronic component housing package.
Figure 16B:
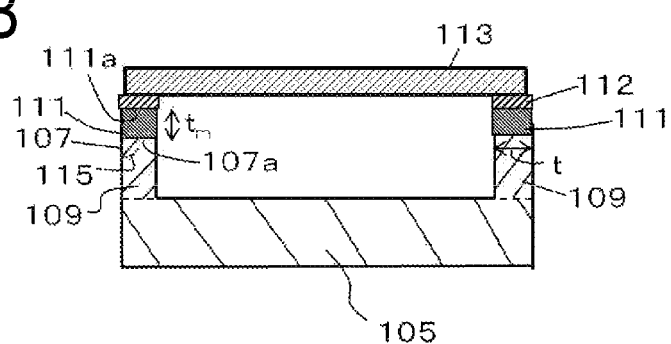
FIG. 16B is schematic cross-sectional view taken along line X-X of FIG. 16A.
Figure 17A:
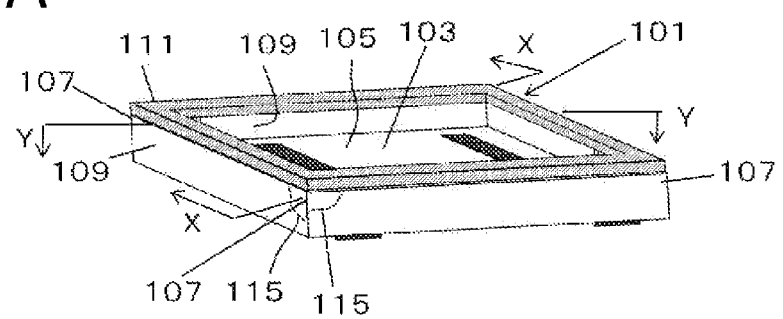
FIG. 17A is schematic perspective view of a conventional electronic component storage substrate.
Figure 17B:
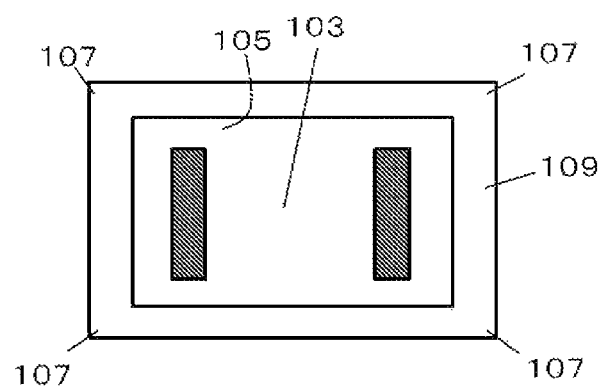
FIG. 17B is a plan view of the electronic component storage substrate illustrated in FIG. 17A as seen from the position of the line Y-Y.

Next, the base mold was manufactured using the sheet formed body according to the method illustrated in FIGS. 16B1 and 16B2. In this configuration, the shapes of both the convex portion of the base mold and the recessed portion formed on the convex portion were adjusted using a metal mold where the shapes of the protruding portion and the small protruding portion had been modified. In addition, the sample of FIG. 6 illustrated in Table 1 was produced using a condition that specified a firing temperature roughly 20° C. higher than that of the sample in FIGS. 1A and 1B.

Next, a Mo metal powder paste printing pattern was formed on the top surface of the convex portion including the recessed portion of the base mold, and a printing pattern was also formed as the surface electrical conductor layer in the area that would become the mounting surface. In this case, a metal powder paste having a viscosity reduced to roughly ½ of that used to prepare the sample described in the following example was used. The viscosity was reduced by the addition of a solvent to the metal powder paste.

Next, the manufactured base mold was cut at the locations illustrated in FIGS. 16B1 and 16B2 to produce the concave shaped body, and the concave mold was subsequently fired according to the predetermined temperature criterion to obtain the electronic component storage substrate. The thickness of the metal layer of the obtained electronic component storage substrate of Sample No. 1 had an inner and outer surface thickness of 20 μm, but Sample Nos. 3 to 6 had inner-outer surface thicknesses of 5 to 20 μm and an outer surface thickness of 1 to 10 μm; accordingly, each of the above samples were formed thinly from the inner surface to the outer surface.

Also, the obtained electronic component storage substrate had a planar area of 2 mm×2 mm, a substrate thickness of 0.1 mm, an average substrate bank section thickness of 0.15 mm, and a substrate bank section mounting surface height of 0.2 mm.

Further, an electronic component storage substrate having a similar shape to that of Sample No. 2 was produced using a method in which the vacuum degree within the metal mold was lowered during the second half of the press molding process with respect to the first half.

Next, a silver solder (eutectic Ag—Cu solder) was used as a bonding material on the surface of the metal layer of the substrate bank section of the plated electronic component storage substrate, and a lid formed of 0.2 mm thick Kovar (Fe—Ni—Co alloy) was bonded by a roller-type seam welding process.

In the sealing test, the number of substrate crack occurrences was counted with respect to 20 samples subjected to sealing mounting.

In the reliability test, a temperature cycle test was performed with respect to sealed samples (evaluation sample size: 30 samples, 1000·1500/2000 hours), helium leakage was evaluated, and the number of samples where leakage occurred was counted.

As a comparative example (Sample No. 1), a metal mold without the small protruding portion was used to create the base mold during the base mold creation process, and a concave mold with a flat top surface surrounding the recessed portion was produced. With respect to the above example, a metal powder paste having a viscosity twice that of the metal powder paste used in the preceding samples (Sample Nos. 2 to 6) was used to form the metal layer. Subsequently, the sample was processed using the same method to produce the electronic component housing package, and the effectiveness of the hermetic seal was similarly evaluated. The thickness of the metal layer of the sample as a Comparative Example was 20 μm from the inner surface to the outer surface.

TABLE 1

| Sample No. | Substrate shape | Sealing Test | Reliability Test 1000 Hours | Reliability Test 15000 Hours | Reliability Test 2000 Hours |
|---|---|---|---|---|---|
| 1 | FIGS. 16A and 16B (FIGS. 17A and 17B) | 3 | 5 | 25 | — |
| 2 | FIGS. 1A and B (FIGS. 2A to 2D) | 0 | 0 | 5 | 10 |
| 3 | FIG. 3 | 0 | 0 | 3 | 5 |
| 4 | FIG. 4 | 0 | 0 | 1 | 3 |
| 5 | FIG. 5 | 0 | 0 | 0 | 2 |
| 6 | FIG. 6 | 0 | 0 | 0 | 0 |

As can be seen from Table 1, among the manufactured samples in which the upper surface of the corner portion of the substrate bank section was slanted such that the height decreased from the inner surface toward the outer surface such as in Sample Nos. 2 to 6, no defects were detected during the sealing test; in the sample of the above-described Comparative Example (Sample No. 1), however, defects were observed in three of the 20 samples evaluated.

Further, with respect to the reliability test as well, Sample Nos. 2 to 6 had fewer occurrences of helium leaks in comparison to Sample No. 1.

Also, similar characteristics were observed for samples prepared using the method in which the vacuum degree within the metal mold was lowered during the second half of the press-molding process with respect to the first half.

Example 2

In addition, the electronic component storage substrate having the shape illustrated in FIGS. 7A to 10C, 11C and 12A and 12B was produced using the sheet formed body of Example 1, and was subsequently evaluated. The height (h2) of the notched portion was formed to be ⅓ of the thickness of the substrate. The mold was fired according to the same conditions utilized for Sample Nos. 1 to 5 of Example 1. In this case, the metal mold illustrated in FIG. 15 was used as a basic metal mold. Note that, for production of the base mold of the electronic component storage substrate of the tenth embodiment illustrated in FIGS. 12A and 12B, a lower metal mold formed with a concave bottom surface was used in place of the lower metal mold used for production of the base mold of the electronic component storage substrate illustrated in FIGS. 7A to 7C. Also, the shape of the notch formed in the substrate was modified by adjusting the shape of the projecting portion formed in the bottom surface of the lower metal mold.

Further, a Mo metal powder paste was printed on the surface of the notch formed in the substrate side of the produced electronic component storage substrate to produce a metalization film, and a plating film of Ni and a plating film of Au were subsequently formed thereon in this order.

Next, a lid was bonded to the produced electronic component mounting substrate in the same fashion as in Example 1.

Thereafter, a sealing test and a reliability test (temperature cycle test; sample size: 30 samples, 1000 hours) were performed on the prepared sample under the same conditions as in Example 1.

In addition, among the produced electronic component mounting substrates, samples of eutectic solder were prepared for filling in the notch portion on the substrate side (only for the four corners of those illustrated in FIGS. 7A to 7C, 8A to 8C, 9A to 9C, 11C and 12A and 12B). In this way, a sample of the electronic component mounting substrate produced with an attached lid was mounted to an FR-4 motherboard. A reflow furnace (maximum temperature: 300° C.) was utilized for the mounting process. In this case, the eutectic solder filled in the notch portion of the electronic component mounting substrate was bonded to the conductor layer (Cu) of the motherboard. The number of samples was 100. After the reflow process, the presence of cracks in the vicinity of the notch formed on the substrate side was evaluated.

TABLE 2

| Sample No. | Substrate shape | Sealing Test | Reliability Test 1000 Hours | Reflow Test Quantity/100 |
|---|---|---|---|---|
| 7 | FIGS. 7A to 7C | 0 | 0 | 8 |
| 8 | FIGS. 8A to 8C | 0 | 0 | 9 |
| 9 | FIGS. 9A to 9C | 0 | 0 | 8 |
| 10 | FIGS. 10A to 10C | 0 | 0 | 9 |
| 11 | FIG. 11C | 0 | 0 | 53 |
| 12 | FIGS. 12A and 12B | 0 | 0 | 15 |

The samples were examined after the reflow process, and it was observed that for samples having a rectangular notch shape when the substrate was viewed in cross section (the shape of FIG. 11C), 53 defects occurred, however 15 or less defects occurred in the case of the other samples (Sample Nos. 7 to 10 and 12). Note that no defects were found in these samples in the sealing test or the reliability test.

REFERENCE SIGNS LIST

A, B, C, D, E, 101, F, G, H, I Electronic component storage substrate
1, 103 Mounting surface
3, 105 Substrate
5, 109 Substrate bank section
5A, 107 Corner portion
5Aa Top surface (of the corner portion)
5Ab Inner surface (of the corner portion)
5Ac Outer surface (of the corner portion)
5Aac Center portion (of the top surface of the corner portion)
6 Surface electrical conductor layer
9, 111 Metal layer
7, 113 Lid
10,100 Electronic component
13a Bottom surface (of the substrate)
13b Side surface (of the substrate)
13c Ridge portion (of the substrate)
13d Corner (of the substrate)
15 Connecting surface
17 Notch
19 Bonding material
20 Motherboard
21 Sheet formed body
23 Metal mold
23a Protruding portion (of the metal mold)
25 Maternal molded body
25a Recessed portion (of the base mold)
25b Convex portion (of the base mold)
25c Recessed portion (of the base mold)
27 Concave shaped body
29 Printing pattern

The invention claimed is:
1. An electronic component storage substrate comprising:
a substrate;
a rectangular frame-shaped substrate bank section provided on the substrate and comprising a corner portion comprising four corners; and
a metal layer provided on a top surface of the substrate bank section; wherein
an upper surface of the corner portion of the substrate bank section comprises an inclined portion slanted downward from an inner surface of the substrate bank section toward an outer surface, and a thickness of the corner portion cut along a diagonal direction in the plan view the substrate gradually increases from the top surface toward the substrate.

2. The electronic component storage substrate according to claim 1, wherein the metal layer provided on the corner portion has a thickness that decreases from an inner surface to an outer surface of the substrate bank section.

3. The electronic component storage substrate according to claim 1, wherein the upper surface of the corner portion comprises a curved surface convexed upward.

4. The electronic component storage substrate according to claim 1, wherein a thickness of the substrate bank section increases from the top surface toward the substrate.

5. The electronic component storage substrate according to claim 1, wherein an angle formed between the inner surface of the substrate bank section and a main surface of the substrate is an acute angle.

6. The electronic component storage substrate according to claim 1, wherein the substrate further comprises:
a mounting surface for mounting electronic components; and
a first connecting surface for connecting, when a surface of the substrate opposite to the mounting surface constitutes a bottom surface and a surface substantially perpendicular to the bottom surface constitutes a side surface, the bottom surface and the side surface.

7. The electronic component storage substrate according to claim 6, wherein the first connecting surface is provided so as to form an inclined surface between the bottom surface and the side surface.

8. The electronic component storage substrate according to claim 7, wherein the inclined surface is provided so as to form a convex curved surface.

9. The electronic component storage substrate according to claim 7, wherein the inclined surface is provided so as to form a recessed curved surface.

10. The electronic component storage substrate according to claim 1, wherein the substrate has a rectangular shape; and further comprises:
a mounting surface for mounting electronic components; and
a second connecting surface for connecting, when a surface of the substrate opposite to the mounting surface constitutes a bottom surface and four surfaces substantially perpendicular to the bottom surface constitute side surfaces, the bottom surface and at least two of the side surfaces.

11. The electronic component storage substrate according to claim 10, wherein the second connecting surface is provided so as to form an inclined surface between the bottom surface and the side surfaces.

12. The electronic component storage substrate according to claim 11, wherein the inclined surface is provided so as to form a convex curved surface.

13. The electronic component storage substrate according to claim 11, wherein the inclined surface is provided so as to form a recessed curved surface.

14. The electronic component storage substrate according to claim 1, wherein both the substrate and the substrate bank section are made of ceramic material, and are fused together by sintering.

15. An electronic component storage package, comprising a lid welded onto a metal layer provided on a substrate bank section of an electronic component storage substrate according to claim 1.

16. An electronic component storage substrate comprising:
   a substrate comprises a mounting surface for mounting thereon electronic components;
   a rectangular frame-shaped substrate bank section provided on the substrate and comprising a corner portion comprising four corners; and
   a metal layer provided on a top surface of the substrate bank section; wherein
   the substrate bank section has an inner and an outer surfaces that are connected to the substrate from the top surface, the inner surface being positioned on the mounting surface side,
   both the inner and the outer surfaces of the substrate bank section slant toward the mounting surface, and
   an upper surface of the corner portion of the substrate bank section comprises an inclined portion slanted downward from the inner surface of the substrate bank section toward the outer surface.

17. The electronic component storage substrate according to claim 16, wherein a thickness of the metal layer provided on the corner portion decreases from an inner surface to an outer surface of the substrate bank section.

18. The electronic component storage substrate according to claim 16, wherein the upper surface of the corner portion comprises a curved surface convexed upward.

19. The electronic component storage substrate according to claim 16, wherein a thickness of the substrate bank section increases from the top surface toward the substrate.

20. The electronic component storage substrate according to claim 16, wherein a bottom surface is curved in a convex shape, when a surface of the substrate opposite to the mounting surface constitutes the bottom surface.

* * * * *